(12) United States Patent
Liao

(10) Patent No.: US 7,578,684 B2
(45) Date of Patent: Aug. 25, 2009

(54) SOCKET ASSEMBLY HAVING A VACUUM PICKUP CAP

(75) Inventor: Fang-Jun Liao, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/002,741

(22) Filed: Dec. 18, 2007

(65) Prior Publication Data

US 2008/0146044 A1  Jun. 19, 2008

(51) Int. Cl.
*H01R 13/44* (2006.01)
(52) U.S. Cl. ........................................ 439/135; 439/940
(58) Field of Classification Search ............... 439/135, 439/41, 940
See application file for complete search history.

(56) References Cited

U.S. PATENT DOCUMENTS 6,478,588 B1 * 11/2002 Howell et al. ............... 439/135
6,783,369 B2     8/2004 Zhang

* cited by examiner

*Primary Examiner*—Khiem Nguyen
(74) *Attorney, Agent, or Firm*—Wei Te Chung

(57) ABSTRACT

A socket assembly (100) adapted for being sucked by a vacuum pickup device has a housing (10) and a vacuum pickup cap (20) mounted to the housing. The vacuum pickup cap has a smooth upper face (21) adapted for being sucked by the vacuum pickup device and a pair of connecting portions (22) respectively disposed at a pair of opposite edges thereof. The vacuum pickup cap includes a pair of projecting portions (23) respectively extending from the connecting portion. Each projecting portion has a touching portion (231) extending upwardly from an upper side thereof and a protrusion (24) formed at a lower side thereof for coupling with the housing.

11 Claims, 3 Drawing Sheets

SOCKET ASSEMBLY HAVING A VACUUM PICKUP CAP

BACKGROUND OF THE INVENTION

1. Field of the Invention

The present invention relates to a socket assembly, and particularly to a socket assembly having a vacuum pickup cap for facilitating manipulation of an electrical connector onto an electronic apparatus.

2. Description of Prior Arts

With the development of the technology, manual assembling is replaced by automatic assembling. Generally, during the automation of assembling an electrical connector to a printed circuit board, frequently, a vacuum suction nozzle is used to pick up the electrical connector from one position to another position. A pick-up cap having a suction portion can be mounted on many types of electrical connectors. The vacuum suction nozzle engages with the suction portion of the pick-up cap to thereby picking up the electrical connector.

U.S. Pat. No. 6,783,369 issued on Aug. 31, 2004 discloses an electrical connector having a housing and a pick-up cap for facilitating manipulation of the electrical connector on an electronic apparatus. The pick-up cap includes a suction portion to be sucked by a vacuum suction nozzle. A rectangular positioning portion is formed at one end of the suction portion. A pair of spaced positioning arms are formed at an opposite end of the suction portion. Each positioning arm has a bulge engaging with corresponding holes located on the housing and extending from a free end thereof, toward the connector. The positioning portion has a pair of side blocks and a positioning block defined thereon, toward the connector for coupling with the housing. That is, a small space is defined between the blocks and the surface of the housing for facilitating manipulation of the pick-up cap off the housing.

In use, the pick-up cap is picked off from the housing. A central processing unit (CPU) is mounted to the housing. However, it is difficult to pick the pick-up cap off manually.

Hence, it is desirable to provide an improved land grid array connector to overcome the aforementioned disadvantages.

SUMMARY OF THE INVENTION

An object of the present invention is to provide an socket assembly having an improved vacuum pickup cap easily picked off from a housing of the socket assembly.

To achieve the above object, a socket assembly for being sucked by a vacuum pickup device. The socket assembly comprises a housing and a vacuum pickup cap mounted to the housing for facilitating manipulation of the socket assembly on the printed circuit board (not shown). The vacuum pickup cap has a pair of connecting portions disposed at a pair of opposite edges thereof, respectively. The vacuum pickup cap further has a pair of projecting portions respectively extending from the connecting portion. Each projecting portion has a touching portion extending upwardly from an upper side thereof and a protrusion formed at a lower side thereof for engaging with the housing.

During the process of picking off the vacuum pickup cap, the opposite touching portions are pressed inwardly with hands and the protrusions move away from the housing. That is, the vacuum pickup cap is easily picked off from the housing.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
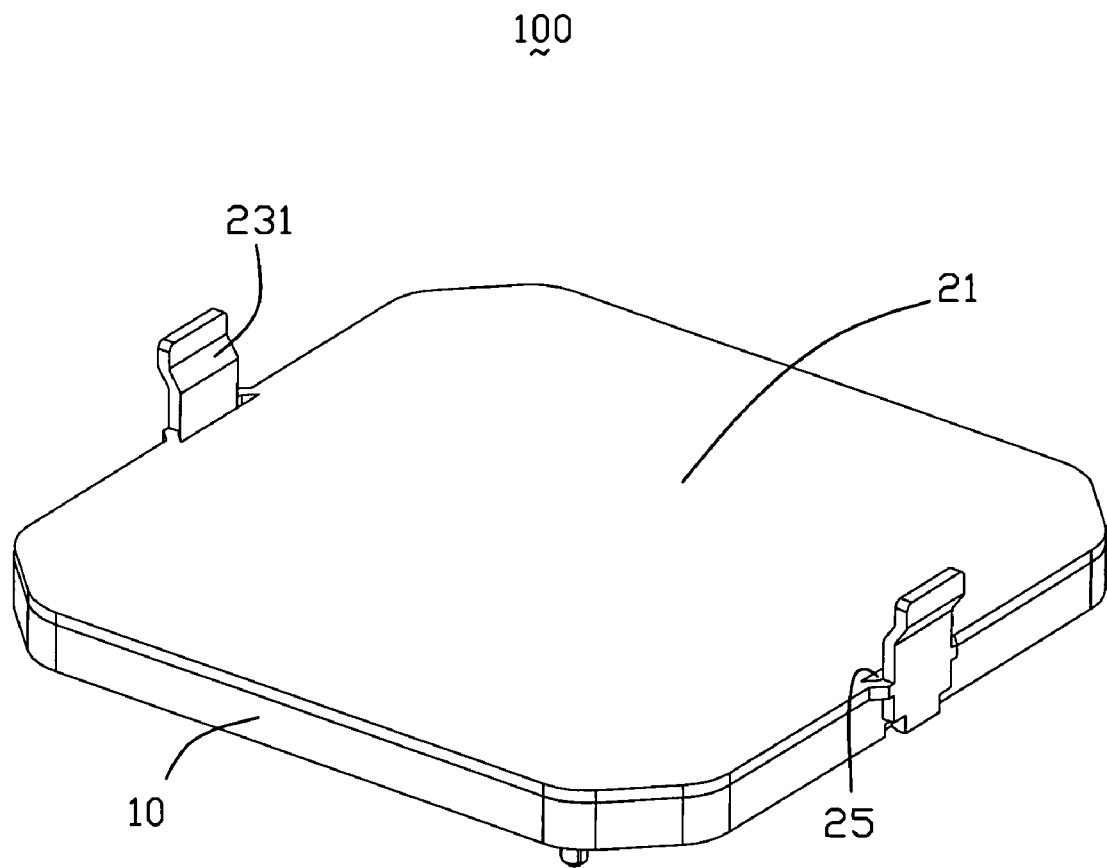
FIG. 1 is an assembled perspective view of a socket assembly of the present invention.
Figure 2:
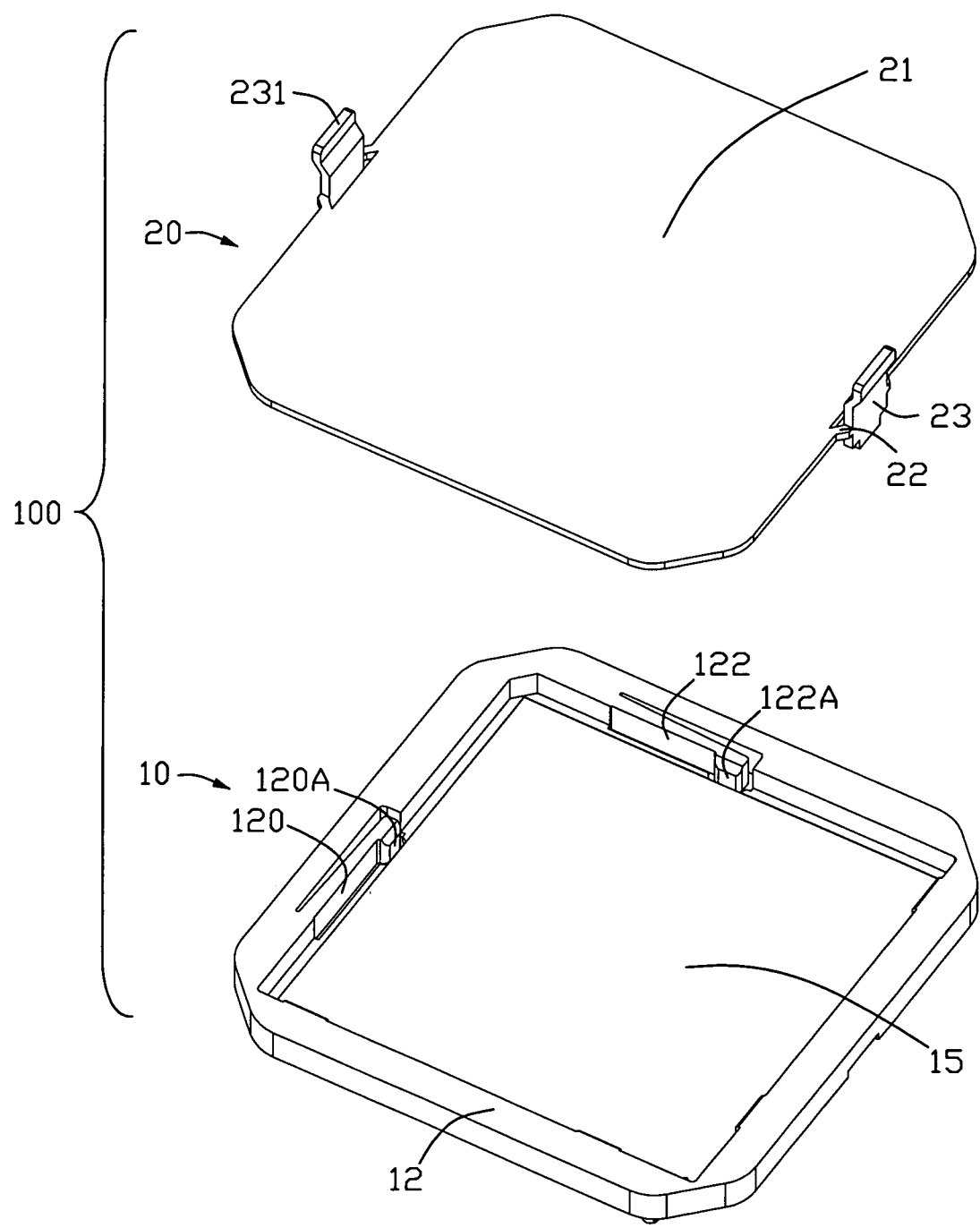
FIG. 2 is an exploded view of the socket assembly as shown in FIG. 1.
Figure 3:
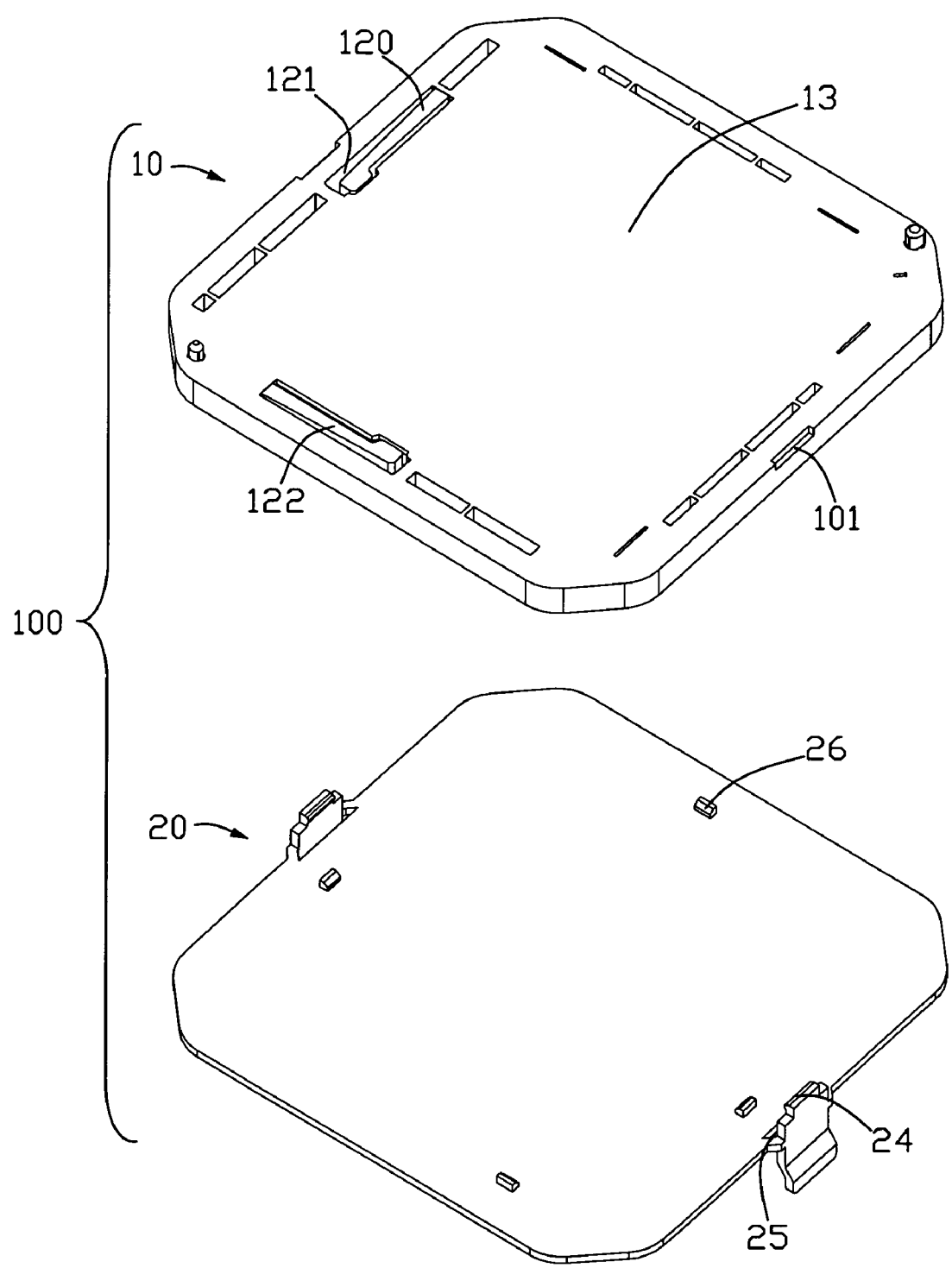
FIG. 3 is another exploded view of the socket assembly as shown FIG. 2, taken from another aspect.

Reference will now be made to the drawing figures to describe the present invention in detail. Referring to FIGS. 1-3, a CPU socket assembly 100 in accordance with the embodiment of the present invention comprises a housing 10 assembled onto a printed circuit board (not shown), a vacuum pickup cap 20 mounted to the housing 10.

The housing 10 is of rectangular configuration. The housing 10 has a base 13 having four side walls 12 surrounding the base 13. A plurality of passageways (not labeled) defined in the base 13 for receiving a corresponding number of electrical terminals (not labeled) therein. A pair of adjacent side walls 12 respectively has a first spring arm 120 and a second spring arm 122 extending inwardly therefrom. The first and the second spring arm 120, 122 respectively includes an arced contacting portion 120A and 122A for resisting against the CPU firmly.

A vacuum pickup cap 20 for facilitating manipulation of the socket assembly 100 on an electronic apparatus (not shown) is substantially lamelliform. The vacuum pickup 20 comprises a smooth upper face 21 adapted for being sucked by the vacuum pickup device (not shown) and four cams 26 disposed on a bottom surface thereof for positioning toward the base 13. The vacuum pickup cap 20 has a pair of connecting portions 22 extending horizontally outwardly from opposite edges thereof and a pair of corresponding projecting portions 23 respectively extending upwardly and downwardly from the connecting portion 22 and perpendicular to the connecting portion 22. The projecting portion 23 has a touching portion 231 extending upwardly from an upper side thereof and a protrusion 24 extending inwardly from a lower end thereof for engaging with a cavity 101 defined at an edge portion of the bottom surface of the base 13 of the housing 1.

During the process of picking off the vacuum pickup cap 20, the opposite touching portions 231 are pressed inwardly with hands and the protrusions 24 move away from the cavity 101. That is, the vacuum pickup cap 20 is easily picked off from the base 13 of the housing 10.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A socket assembly adapted for being sucked by a vacuum pickup device, comprising:
   a housing comprising a base;
   a plurality of terminals mounted in the base; and a vacuum pickup cap mounted to the housing and comprising:
- a smooth upper face adapted for being sucked by the vacuum pickup device;
- a pair of beams disposed at a pair of opposite edges thereof, respectively;
- a pair of projecting portions respectively connected to a corresponding beam, each projecting portion having a touching portion extending upwardly from an upper side thereof and a protrusion formed at a lower side thereof for coupling with the housing; and
- a through hole defined between the projecting portion and edge of the vacuum pickup cap not only for increasing flexibility of said projecting portion for easy operation but also for forming the protrusion during injection molding.

2. The socket assembly as claimed in claim 1, wherein said housing has a pair of cavities defined on a bottom surface thereof, said protrusion extending inwardly for engaging with the cavity.

3. The socket assembly as claimed in claim 1, wherein said vacuum pickup cap has a plurality of cams disposed on a bottom surface thereof for coupling with the housing.

4. The socket assembly as claimed in claim 1, wherein said housing comprises four side walls surrounding the base, one side wall having a first spring arm extending inwardly.

5. The socket assembly as claimed in claim 4, wherein another side wall adjacent to the one side wall has a second spring arm extending inwardly.

6. The socket assembly as claimed in claim 5, wherein each of said first spring arm and said second spring arm has an arced contacting portion.

7. A socket assembly comprising:
- an insulative housing defining a receiving cavity in an upward face;
- at least one spring arm with a head extending inwardly transversely into the receiving cavity; and
- a pick up cap positioned upon the housing and defining a plate covering the receiving cavity and a pair of lever type latches on two side edge of the plate;

wherein
each of said lever type latch includes an upper operation section accessible from an exterior, and a lower locking section locked into an underside of the housing and actuated by said upper operation section; and
said plate defines a through hole adjacent to the corresponding latch not only for increasing flexibility of said latch for easy operation but also for forming a hook of said locking section during injection molding.

8. The assembly as claimed in claim 7, wherein an underside of said plate forms a plurality of cams for engagement with a circumferential wall of the housing.

9. The assembly as claimed in claim 7, wherein said housing defines a pair of recesses in the underside to receive corresponding hooks of the locking section.

10. An electrical connector assembly comprising:
- an insulative housing defining an upward receiving cavity therein;
- a pick up cap positioned upon the housing, said pick up cap including:
- a plate covering the receiving cavity and having a smooth upper face thereon;
- a pair of lever type latches unitarily formed on two side edges of the plate;

wherein
said plate further forms a pair of through holes adjacent to the corresponding latches each for not only increasing flexibility of the corresponding latch but also facilitating formation of a hook of the latch, which locks to the housing, during injection molding.

11. The electrical connector assembly as claimed in claim 10, wherein said latch further includes an operation section opposite to the hook in a vertical direction and further outwardly offset from the hook in a transverse direction, which is parallel to a moving direction of said latch in a top view, so as to spare a space for viewing, via said through hole, disengagement of the hook from the housing during inward movement of the operation section in said transverse direction.

* * * * *